US010943990B2

(12) United States Patent
Greene et al.

(10) Patent No.: US 10,943,990 B2
(45) Date of Patent: Mar. 9, 2021

(54) GATE CONTACT OVER ACTIVE ENABLED BY ALTERNATIVE SPACER SCHEME AND CLAW-SHAPED CAP

(71) Applicant: International Business Machines Corporation, Armonk, NY (US)

(72) Inventors: Andrew Greene, Albany, NY (US); Victor W. C. Chan, Guilderland, NY (US); Gangadhara Raja Muthinti, Albany, NY (US); Veeraraghavan Basker, Schenectady, NY (US); Junli Wang, Slingerlands, NY (US); Kisik Choi, Watervliet, NY (US); Su Chen Fan, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 69 days.

(21) Appl. No.: 16/171,081

(22) Filed: Oct. 25, 2018

(65) Prior Publication Data

US 2020/0135886 A1  Apr. 30, 2020

(51) Int. Cl.
*H01L 29/66* (2006.01)
*H01L 21/28* (2006.01)
*H01L 29/417* (2006.01)

(52) U.S. Cl.
CPC .... *H01L 29/6656* (2013.01); *H01L 21/28132* (2013.01); *H01L 29/41775* (2013.01); *H01L 29/6653* (2013.01)

(58) Field of Classification Search
CPC combination set(s) only.
See application file for complete search history.

(56) References Cited

U.S. PATENT DOCUMENTS 7,875,913 B2  1/2011  Rhodes
9,385,069 B2  7/2016  Liu et al.
(Continued)

FOREIGN PATENT DOCUMENTS

WO   WO2016160120 A1   10/2016

OTHER PUBLICATIONS

IBM, "Trench Silicide Contacts," IP.com, IPCOM000184829D, Jul. 1, 2009 (2 pages).
(Continued)

*Primary Examiner* — Daniel Whalen
(74) *Attorney, Agent, or Firm* — Douglas Pearson; Michael J. Chang, LLC

(57) ABSTRACT

Gate contact over active layout designs are provided. In one aspect, a method for forming a gate contact over active device includes: forming a device including metal gates over an active area of a wafer, and source/drains on opposite sides of the metal gates offset by gate spacers; recessing the metal gates/gate spacers; forming etch-selective spacers on top of the recessed gate spacers; forming gate caps on top of the recessed metal gates; forming source/drain contacts on the source/drains; forming source/drain caps on top of the source/drain contacts, wherein the etch-selective spacers provide etch selectivity to the gate caps and source/drain caps; and forming a metal gate contact that extends through one of the gate caps, wherein the etch-selective spacers prevent gate-to-source drain shorting by the metal gate contact. Alternate etch-selective configurations are also provided including a claw-shaped source/drain cap design. A gate contact over active device is also provided.

15 Claims, 6 Drawing Sheets

(56) References Cited

U.S. PATENT DOCUMENTS

| | | |
|---|---|---|
| 9,397,004 B2 | 7/2016 | Bouche et al. |
| 9,397,049 B1 | 7/2016 | Fan et al. |
| 9,461,143 B2 | 10/2016 | Pethe et al. |
| 9,508,818 B1 | 11/2016 | Basker et al. |
| 9,508,825 B1 | 11/2016 | Basker et al. |
| 9,570,573 B1 | 2/2017 | Fan et al. |
| 9,627,257 B2 | 4/2017 | Fan et al. |
| 9,722,043 B2 | 8/2017 | Basker et al. |
| 9,761,496 B2 | 9/2017 | Basker et al. |
| 9,761,677 B2 | 9/2017 | Liu et al. |
| 9,818,876 B1 | 11/2017 | Bouche |
| 2011/0156107 A1 | 6/2011 | Bohr et al. |
| 2014/0077305 A1 | 3/2014 | Pethe et al. |
| 2015/0060960 A1 | 3/2015 | Xie et al. |
| 2015/0069532 A1 | 3/2015 | Xie et al. |
| 2017/0004998 A1 | 1/2017 | Pethe et al. |
| 2017/0263557 A1 | 9/2017 | Clevenger et al. |
| 2018/0211874 A1* | 7/2018 | Basker .............. H01L 21/76834 |

OTHER PUBLICATIONS

M. Carmona et al., "Study of gate contact over active area," 29th Symposium on Microelectronics Technology and Devices (SBMicro), Oct. 2014, 4 pages.

* cited by examiner

GATE CONTACT OVER ACTIVE ENABLED BY ALTERNATIVE SPACER SCHEME AND CLAW-SHAPED CAP

FIELD OF THE INVENTION

The present invention relates to gate contact over active layout designs, and more particularly, to gate contact over active layouts employing an alternative spacer scheme and claw-shaped cap.

BACKGROUND OF THE INVENTION

With conventional complementary metal-oxide semiconductor (CMOS) device layouts, gate contacts are typically provided over shallow trench isolation (STI) away from the active regions in order to prevent gate to source/drain shorting. Doing so, however, results in a significant penalty in layout area.

Area scaling is however needed for future technology nodes such as static random access memory (SRAM)/logic cells. As such, gate contact over active layout designs have been proposed. See, for example, U.S. Pat. No. 9,461,143 issued to Pethe et al., entitled "Gate Contact Structure Over Active Gate and Method to Fabricate Same" (hereinafter "U.S. Pat. No. 9,461,143"). However, while U.S. Pat. No. 9,461,143 employs gate contacts over the active gate, the structures provided run the risk of gate to source/drain shorting when there is misalignment of the contact to the gate.

Therefore, improved gate contact over active layout designs that prevent gate to source/drain shorting would be desirable.

SUMMARY OF THE INVENTION

The present invention provides gate contact over active layout designs. In one aspect of the invention, a method for forming a gate contact over active device is provided. The method includes: forming a device having metal gates over an active area of a wafer, and source and drains on opposite sides of the metal gates offset from the metal gates by gate spacers; recessing the metal gates and the gate spacers; forming etch-selective spacers on top of the recessed gate spacers; forming gate caps on top of the recessed metal gates in between the etch-selective spacers; forming source and drain contacts on the source and drains; forming source and drain caps on top of the source and drain contacts, wherein the etch-selective spacers are present between the gate caps and the source and drain caps and provide etch selectivity to both the gate caps and the source and drain caps; and forming a metal gate contact that extends through a given one of the gate caps, wherein the etch-selective spacers prevent gate-to-source drain shorting by the metal gate contact.

In another aspect of the invention, another method for forming a gate contact over active device is provided. The method includes: forming a device including metal gates over an active area of a wafer, and source and drains on opposite sides of the metal gates offset from the metal gates by gate spacers; recessing the metal gates; forming gate caps on top of the recessed metal gates; recessing the gate spacers selective to the gate caps; forming etch-selective spacers on top of the recessed gate spacers alongside the gate caps; forming source and drain contacts on the source and drains; forming source and drain caps on top of the source and drain contacts, wherein the etch-selective spacers are present between the gate caps and the source and drain caps and provide etch selectivity to both the gate caps and the source and drain caps; and forming a metal gate contact that extends through one of the gate caps, wherein the etch-selective spacers prevent gate-to-source drain shorting by the metal gate contact.

In yet another aspect of the invention, yet another method for forming a gate contact over active device is provided. The method includes: forming a device including metal gates over an active area of a wafer, and source and drains on opposite sides of the metal gates offset from the metal gates by gate spacers; recessing the gate spacers selective to the metal gates; forming first source and drain cap components on top of the recessed gate spacers; recessing the metal gates selective to the first source and drain cap component; forming gate caps on top of the recessed metal gates; forming source and drain contacts on the source and drains in between the first source and drain cap components; recessing the source and drain contacts; forming second source and drain cap components on top of the recessed source and drain contacts, wherein the first source and drain cap components together with the second source and drain cap components form claw-shaped caps over the recessed source and drain contacts; and forming a metal gate contact that extends through one of the gate caps, wherein the claw-shaped caps over the recessed source and drain contacts prevent gate-to-source drain shorting by the metal gate contact.

In still yet another aspect of the invention, a gate contact over active device is provided. The device includes: metal gates over an active area of a wafer; source and drains on opposite sides of the metal gates offset from the metal gates by gate spacers; gate caps on top of the metal gates; an etch-selective material on top of the gate spacers alongside the gate caps which provides etch selectivity to the gate caps; source and drain contacts on the source and drains; source and drain caps on top of the source and drain contacts; and a metal gate contact that extends through a given one of the gate caps, wherein the etch-selective spacers prevent gate-to-source drain shorting by the metal gate contact.

A more complete understanding of the present invention, as well as further features and advantages of the present invention, will be obtained by reference to the following detailed description and drawings.

DETAILED DESCRIPTION OF PREFERRED EMBODIMENTS

Figure 1:
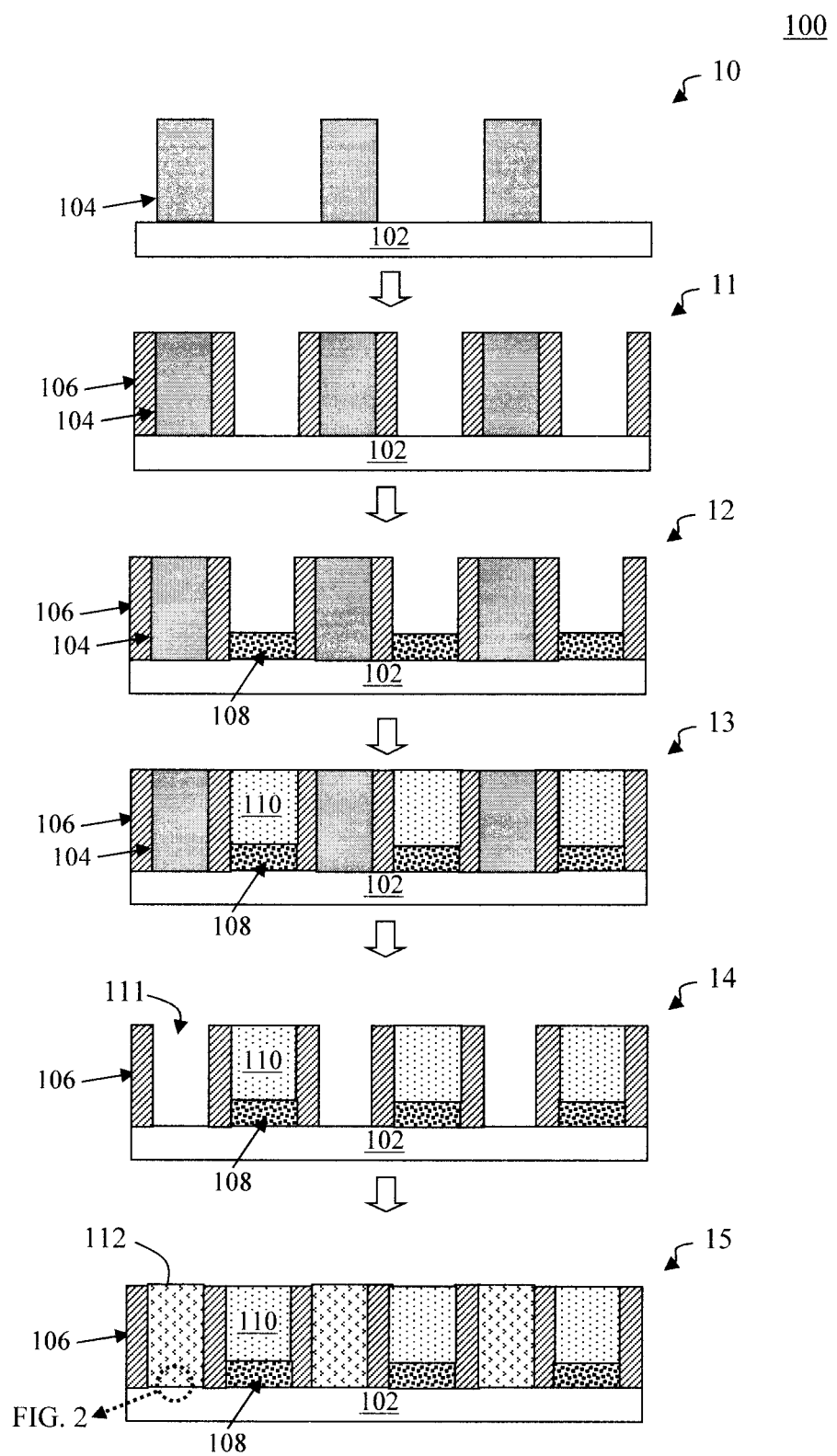
FIG. 1 is a cross-sectional diagram illustrating an exemplary replacement metal gate (RMG) methodology for forming a complementary metal-oxide semiconductor (CMOS) device according to an embodiment of the present invention.

Complementary metal-oxide semiconductor (CMOS) devices generally employ a gate over a channel, and source and drains on opposite sides of the gate that are separated from the gate by spacers. To implement a gate contact over active layout design, a dielectric cap is placed over the gate while another, different dielectric cap is placed over the source and drain contacts. These caps are referred to herein as a 'gate cap' and a 'source/drain cap,' respectively.

Based on their etch selectivity, the source/drain cap protects the source and drain contacts during formation of the gate contact. During this process, a trench is patterned through the gate cap to expose the underlying replacement metal gate. The gate contact is then formed in the trench. Ideally, any misalignment of the gate contact is fully blocked by the source and drain cap. In practice however, such misalignment can undesirably erode the spacers separating the replacement metal gate from the source and drain contact. This erosion occurs because typical gate spacer materials (such as silicon nitride (SiN), silicon oxycarbonitride (SiOCN), silicon borocarbonitride (SiBCN), etc.) do not have high etch selectivity to the gate cap (typically SiN for gate cap (self-aligned contact cap—SAC cap)). Oftentimes, spacer erosion results in exposure of the source and drain contact below the source/drain cap, resulting in a gate-to-source/drain short. The same challenges exist with formation of the source and drain contacts and the undesired exposure of the replacement metal gate below the gate cap.

Advantageously, provided herein are techniques for preventing gate to source/drain shorting through the use of gate contact over active layout designs where spacer erosion is avoided through the use of a unique, etch-selective 'claw-shaped' cap over the source and drain contacts. As will be described in detail below, this claw-shaped cap includes a horizontal component in between two vertical components (like an inverted U or claw shape) that cover the top and sides respectively of the source and drain contacts. In some exemplary embodiments, the vertical components of the claw-shaped cap are formed from a different material than the horizontal components. Using a different material along the vertical sidewalls of the cap can provide even more selectivity (pull down) during the source and drain etch. In other exemplary embodiments, the horizontal and vertical components of the claw-shaped caps are formed from the same material.

In each of the embodiments described below, a replacement metal gate or RMG process can be employed. A replacement metal gate (RMG) process involves forming a sacrificial or 'dummy' gate over the channel which allows placement of the source and drains, after which the dummy gate is removed and replaced with a metal gate. A RMG process flow is advantageous as it prevents exposure of the metal gate materials to potentially damaging conditions such as the elevated temperatures employed during source and drain formation, since the replacement metal gate is not formed until the end of the process. For instance, the high-κ dielectrics employed with metal gate stacks are particularly susceptible to high temperature damage.

An exemplary RMG process flow for forming a CMOS device is depicted in methodology 100 of FIG. 1. As shown in step 10, the process begins with an active area 102 of a wafer. According to an exemplary embodiment, the wafer is a bulk semiconductor wafer, such as a bulk silicon (Si), bulk germanium (Ge), bulk silicon germanium (SiGe) and/or bulk III-V semiconductor wafer. Alternatively, the wafer can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. By way of example only, active area 102 can contain fins, nanowires, nanosheets and/or any other active device configurations known in the art formed using standard complementary metal-oxide semiconductor (CMOS) processing.

Dummy gates 104 are then formed over the active area 102. According to an exemplary embodiment, dummy gates 104 are formed by depositing a dummy gate material onto the wafer, and then using standard lithography and etching techniques to pattern the dummy gate material into the individual dummy gates 104. Suitable dummy gate materials include, but are not limited to, poly silicon and/or amorphous silicon.

In step 11, gate spacers 106 are then formed alongside the dummy gates 104. Suitable materials for the gate spacer 106 include, but are not limited to, silicon oxide, SiN, silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), and combinations thereof. According to an exemplary embodiment, gate spacers 106 are formed by depositing the spacer material(s) (e.g., by atomic layer deposition (ALD), chemical vapor deposition (CVD), etc.), followed by a directional etch such as reactive ion etching (RIE) to form the individual gate spacers 106. Gate spacers 106 serve to offset the dummy gates 104 from the source and drains which are next formed on opposite sides of the dummy gates 104.

Namely, as shown in step 12, source and drains 108 are formed on opposite sides of the dummy gates 104. According to one exemplary embodiment, source and drains 108 are formed from an in-situ doped (i.e., during growth) epitaxial material such as in-situ doped epitaxial Si, carbon doped silicon (Si:C) and/or SiGe. Suitable n-type dopants include, but are not limited to, phosphorous (P), arsenic (As) and/or antimony (Sb). Suitable p-type dopants include, but are not limited to, boron (B), gallium (Ga), indium (In), and thallium (Tl). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metalorganic chemical vapor deposition (MOCVD), ultrahigh vacuum chemical vapor deposition (UHVCVD), low-pressure chemical vapor deposition (LPCVD), limited reaction processing CVD (LRPCVD), or other suitable process. Alternatively, an ex-situ process such as ion implantation can be employed to introduce dopants into the source and drains 108. According to an exemplary embodiment, the source and drains 108 have a dopant concentration of from about $1 \times 10^{19}$ cm$^{-3}$ to about $3 \times 10^{21}$ cm$^{-3}$ and ranges therebetween.

In step 13, the dummy gates 104/source and drains 108 are then buried in an interlayer dielectric (ILD) 110. Suitable ILD materials include, but are not limited to, oxide materials such as silicon oxide (SiO$_x$). Following deposition, the ILD 110 is planarized using a process such as chemical mechanical polishing (CMP) such that the ILD 110 is coplanar with the tops of the dummy gates 104 and covers the source and drains 108. As such, the tops of the dummy gates 104 are now exposed, which enables removal of the dummy gates 104 selective to the ILD 110.

Namely, in step 14, the dummy gates 104 are selectively removed, forming gate trenches 111 in the ILD 110. By way of example only, the dummy gates 104 (e.g., poly silicon and/or amorphous silicon) can be selectively removed using a wet etch (e.g., ammonium hydroxide ($NH_4OH$), tetraethylammonium hydroxide (TEAH), etc.) or dry etch (reactive dry etch) process.

Figure 2:
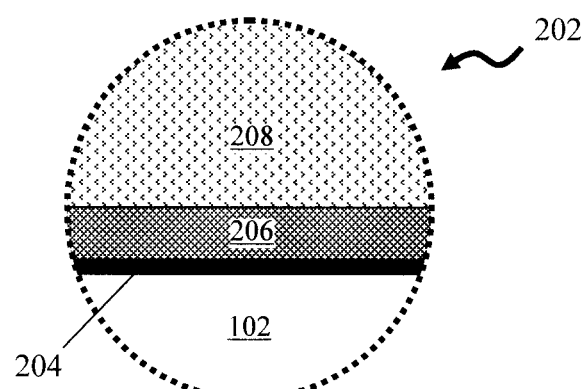
FIG. 2 is a diagram illustrating a magnified view of a gate stack according to an embodiment of the present invention.

In step 15, replacement metal gates 112 (also referred to herein simply as 'gates') are formed in the gate trenches 111. According to an exemplary embodiment, each replacement metal gate 112 is formed from a stack of layers also referred to herein as a 'gate stack.' For instance, referring briefly to a magnified view 202 provided in FIG. 2, in an exemplary embodiment, the replacement metal gate stack includes an interfacial oxide 204 on exposed surfaces of the active area 102, a gate dielectric 206 disposed over the interfacial oxide 204, and a gate conductor 208 disposed on the gate dielectric 206.

By way of example only, interfacial oxide 204 can be formed by an oxidation process. According to an exemplary embodiment, interfacial oxide 204 is formed having a thickness of from about 0.3 nanometers (nm) to about 5 nm and ranges therebetween, e.g., about 1 nm.

Suitable gate dielectrics include, but are not limited to, silicon oxide ($SiO_x$), silicon nitride (SiN), silicon oxynitride ($SiOxNy$), high-κ materials, or any combination thereof. The term "high-K" as used herein refers to a material having a relative dielectric constant κ which is much higher than that of silicon dioxide (e.g., a dielectric constant κ is about 25 for hafnium oxide ($HfO_2$) rather than 3.9 for $SiO_2$). Suitable high-κ materials include, but are not limited to, metal oxides such as hafnium oxide ($HfO_2$), hafnium silicon oxide (HfSiOx), hafnium silicon oxynitride (HfSiOx), lanthanum oxide ($La_2O_3$), lanthanum aluminum oxide ($LaAlO_3$), zirconium oxide ($ZrO_2$), zirconium silicon oxide (ZrSiO4), zirconium silicon oxynitride (ZrSiOxNy), tantalum oxide (TaOx), titanium oxide (TiOx), barium strontium titanium oxide ($BaO_6SrTi_2$), barium titanium oxide ($BaTiO_3$), strontium titanium oxide ($SrTiO_3$), yttrium oxide ($Y_2O_3$), aluminum oxide ($Al_2O_3$), lead scandium tantalum oxide ($Pb(Sc,Ta)O_3$), and/or lead zinc niobite (Pb(Zn,Nb)O). The high-κ can further include dopants such as lanthanum (La), aluminum (Al) and/or magnesium (Mg). The gate dielectric material can be formed by any suitable process or any suitable combination of processes, including but not limited to, thermal oxidation, chemical oxidation, thermal nitridation, plasma oxidation, plasma nitridation, atomic layer deposition (ALD), chemical vapor deposition (CVD), etc. According to an exemplary embodiment, gate dielectric 206 has a thickness of from about 1 nm to about 5 nm and ranges therebetween, although less thicknesses and greater thicknesses are also conceived.

Suitable gate conductors include, but are not limited to, doped polycrystalline or amorphous silicon (Si), germanium (Ge), silicon germanium (SiGe), a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), TaC, TaMgC, carbon nanotubes, conductive carbon, graphene, or any combinations thereof. The gate conductor can further include dopants that are incorporated during or after deposition. In some embodiments, the replacement metal gate stacks 112 may further include a workfunction setting layer between the gate dielectric 206 and gate conductor 208. The workfunction setting layer can be a workfunction metal. The workfunction metal can be any suitable material, including but not limited to a nitride including, but not limited to, titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of conductive materials can serve as both gate conductor and workfunction metal. The gate conductor and workfunction metal can be formed by any suitable process or any suitable combination of multiple processes, including but not limited to, ALD, CVD, physical vapor deposition (PVD), sputtering, plating, evaporation, ion beam deposition, electron beam deposition, laser assisted deposition, chemical solution deposition, etc.

Figure 3:
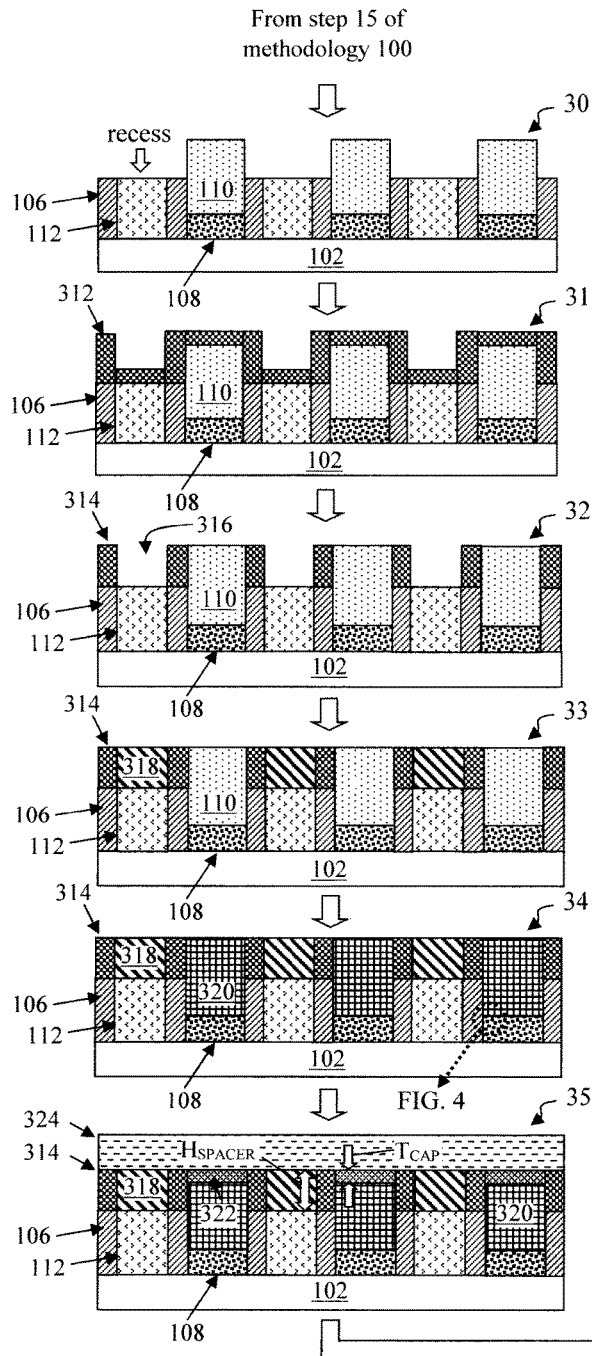
FIG. 3 is a diagram illustrating an exemplary methodology for forming a gate contact over active device with claw-shaped source and drain caps according to an embodiment of the present invention.
Figure 3:
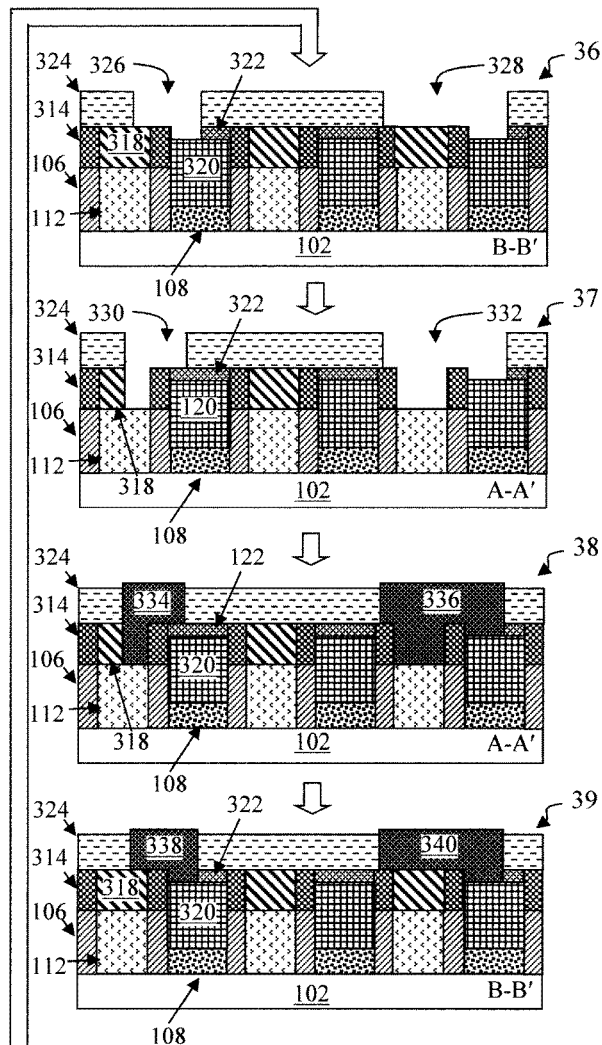

A first exemplary methodology 300 is now described by way of reference to FIG. 3 for forming a gate contact over active device in accordance with the present techniques. The process flow in FIG. 3 follows from the RMG structure produced in accordance with methodology 100 of FIG. 1—described above. Accordingly, like structures are numbered alike in the figures.

As shown in step 30, the replacement metal gates 112 and gate spacers 106 are first recessed relative to the ILD 110. According to an exemplary embodiment, this recess of the replacement metal gates 112/gate spacers 106 is performed using, e.g., a reactive ion etching (RIE) process. As will become apparent from the description below, the depth of this recess sets the height of the alternative, etch-selective spacers that will be formed in between the gate and source/drain caps.

To form the vertical components of the claw-shaped cap, a conformal liner 312 is first formed over the ILD 110 and recessed replacement metal gates 112/gate spacers 106. See step 31. According to an exemplary embodiment, the liner 312 is formed by depositing a suitable liner material using a conformal deposition process such as CVD or ALD to a thickness of from about 2 nanometers (nm) to about 10 nm, and ranges therebetween. Liner 312 serves as the basis for the etch-selective spacers between the gate and source/drain caps. Thus, the liner 312 needs to be formed from a material that provides etch selectivity for both the gate and source/drain caps. As provided above, the vertical component of the claw-shaped caps can be formed from the same material as the horizontal component or, optionally, the vertical component of the claw-shaped caps can be formed from a different material than the horizontal component. For instance, as will be described in detail below, the horizontal component of the claw-shaped caps can be silicon carbide (SiC). In that case, the liner 312 can also be formed from SiC. However, when using different materials for the horizontal and vertical components of the claw-shaped caps, other candidate materials for the liner 312 include, but are not limited to, metal oxides such as aluminum oxide (AlOx)

and/or hafnium oxide (HfOx) and/or metal nitrides such as aluminum nitride (AlN). As provided above, using different materials for the horizontal and vertical components of the claw-shaped caps provides more selectivity/process margin for the gate contact over active scheme.

Next, as shown in step 32, a directional (anisotropic) etching process such as RIE is used to etch back the liner 312, forming etch-selective spacers 314. A directional etch will serve to remove the liner 312 from all horizontal surfaces, leaving spacers 314 present on top of the gate spacers 106 alongside the ILD 110. As highlighted above, with conventional layouts misalignment of the gate contact can undesirably lead to erosion of the gate spacers which do not have high selectivity to the gate cap etch. This erosion can undesirably lead to exposure of the source and drain contact below the source/drain cap, resulting in a gate to source/drain short. However, with the spacers 314 of the present designs, an etch-selective barrier is now present between the gate and source/drain caps preventing gate to source/drain shorts due to spacer erosion.

Trenches 316 are present between the spacers 114 over the replacement metal gates 112. As shown in step 33, gate caps 318 are next formed in the trenches 316 on top of the replacement metal gates 112. To form the gate caps 318, a dielectric material is deposited into and filling the trenches 316. By way of example only, the dielectric material can be deposited using a process such as CVD or ALD. Suitable dielectric materials for the gate caps 318 include, but are not limited to, nitride dielectric materials such as silicon nitride (SiN) and/or silicon oxycarbonitride (SiOCN). As deposited, the dielectric material is planarized using a process such as CMP such that the gate caps 318 are coplanar with the tops of spacers 314. According to an exemplary embodiment, gate caps 318 are formed having a thickness of from about 20 nm to about 45 nm and ranges therebetween. As shown in FIG. 1, the gate caps 318 formed in this manner have etch-selective spacers 314 present along their sidewalls.

Figure 4:
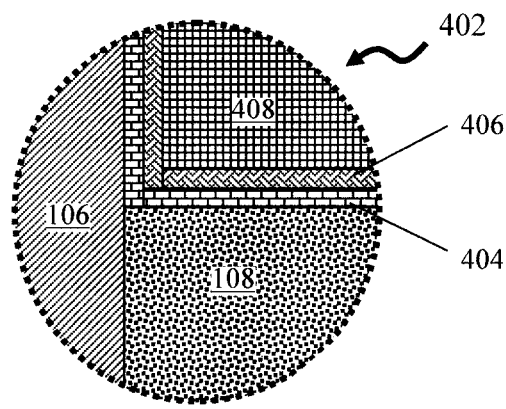
FIG. 4 is a diagram illustrating a magnified view of a source and drain contact according to an embodiment of the present invention.

With the gate caps 318 in place, the ILD 110 is removed from over the source and drains 108 (using a directional/anisotropic etching process such as RIE) and replaced with contacts 320 to the source and drains 108. See step 34. These contacts 320 are also referred to herein as 'source and drain contacts.' Referring briefly to magnified view 402 in FIG. 4, according to an exemplary embodiment, source and drain contacts 320 include multiple layers such as a conformal liner 404/barrier layer 406 and a fill metal 408 disposed on the barrier layer 406.

Liner 404 is for silicide formation. Suitable materials for the liner 404 include, but are not limited to, titanium (Ti), ruthenium (Ru), tantalum (Ta) and/or manganese (Mn). According to an exemplary embodiment, the liner 404 is deposited using a conformal deposition process such as CVD, ALD, or physical vapor deposition (PVD) to a thickness of from about 1 nm to about 10 nm and ranges therebetween. Suitable materials for the barrier layer 406 include, but are not limited to, titanium nitride (TiN) and/or tantalum nitride (TaN). According to an exemplary embodiment, the barrier layer 406 is deposited onto the liner 404 using a conformal deposition process such as CVD, ALD, or PVD to a thickness of from about 5 nm to about 10 nm and ranges therebetween. Suitable fill metals 408 include, but are not limited to, cobalt (Co), tungsten (W), copper (Cu), nickel (Ni), silver (Ag) and/or gold (Au). According to an exemplary embodiment, the fill metal 408 is deposited onto the barrier layer 406 by CVD, ALD, PVD, electrochemical plating, etc.

Referring back to step 35 of methodology 300 (of FIG. 3), source and drain contacts 320 are recessed, and source and drain caps 322 are formed on top of the recessed source and drain contacts 320. Notably, as shown in FIG. 3, spacers 314 have a height $H_{SPACER}$, source and drain caps 322 have a thickness $T_{CAP}$, and $H_{SPACER} > T_{CAP}$. Namely, the goal is to prevent exposing the gate spacers 106 (i.e., to potential erosion) during the gate caps 318 or source/drain caps 322 etch. Thus, the spacers 314 should fully line the sidewalls of both the gate caps 318 and the source/drain caps 322. Based on the present process, the gate caps 318 are formed between trenches 316 between the spacers 314 (see above). Thus, gate caps 318 too will have a thickness that is equivalent to $H_{SPACER}$.

To form the source and drain caps 322, a dielectric material (different from the dielectric material used for the gate caps 318) is deposited onto the recessed source and drain contacts 320. By way of example only, the dielectric material can be deposited using a process such as CVD or ALD. In addition to etch-selectivity vis-à-visi the gate caps 318, the source and drain caps 322 must also have etch selectivity vis-à-vis the spacers 314. As provided above, the spacers 314 (i.e., the vertical component of the claw-shaped cap) can be formed from SiC (like the horizontal component) or a metal oxide such as AlOx and/or HfOx (i.e., a different material from the horizontal component). In that case, the source and drain caps 322 can be formed from a higher-κ metal oxide and/or a metal nitride. For instance, when the spacers 314 are formed from AlOx (a lower-κ metal oxide), the source and drain caps 322 can be formed from HfOx (a higher-κ metal oxide). Alternatively, when the spacers 314 are formed from a metal oxide such as AlOx and/or HfOx, the source and drain caps 322 can be formed from a metal nitride such as AlN. As provided above, the spacers 314 can be formed from a metal nitride. In that case, the source and drain caps 322 can be formed from a metal oxide such as AlOx and/or HfOx.

A (second) ILD 324 (wherein the ILD 110 is the first ILD) is then deposited onto the gate caps 318 and source/drain caps 322. As provided above, suitable ILD materials include, but are not limited to, oxide materials such as silicon oxide ($SiO_x$). Following deposition, the ILD 324 is planarized using a process such as CMP.

Figure 5:
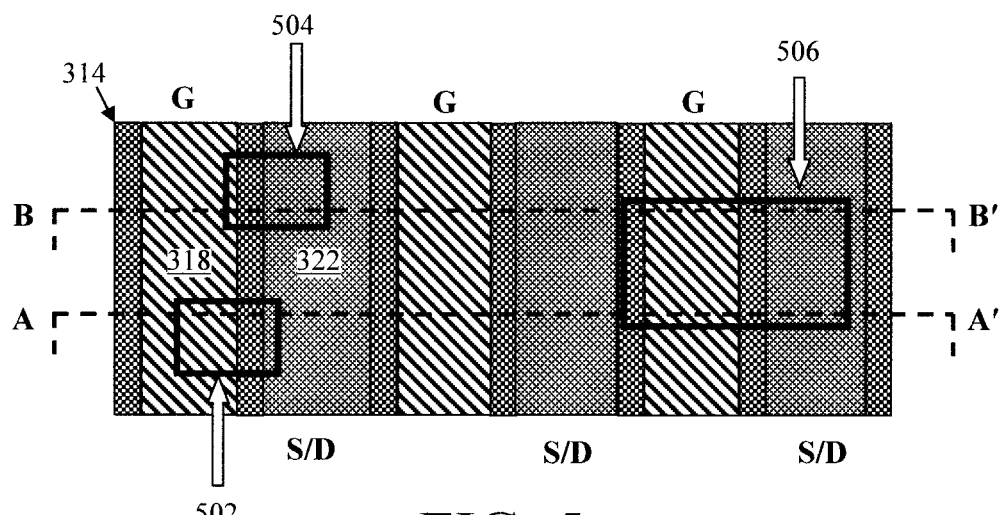
FIG. 5 is a diagram illustrating a top-down view of the device structure according to an embodiment of the present invention.

First/second metal contacts are then formed to the source and drain contacts 320 and to the replacement metal gates 112, respectively. The process for forming these first/second metal contacts will be described by way of reference to different cross-sectional cuts through the device structure. For instance, referring briefly to a top-down view of the device structure in FIG. 5, a cross-sectional cut along A-A' will be used to depict the formation of a (first) metal contact in area 502 to a replacement metal gate 112 (labeled "G"), while a cross-sectional cut along B-B' will be used to depict the formation of a (second) metal contact in area 504 to a source and drain contacts 320 (labeled "S/D"). As shown in FIG. 5, each cut will also depict the formation of metal contact bridges in area 506. Contact bridges provide connections needed for allowing a contact from the source and drain to the replacement metal gate. This way the connection can be local using this scheme.

Referring back to step 36 of methodology 300 (of FIG. 3) (a cross-sectional cut B-B'), standard lithography and etching techniques are used to pattern trenches 326 and 328 in the ILD 324. Specifically, trench 326 corresponds to the footprint and location of a (second) metal contact to the source and drain contact 320. Ideally, trench 326 would be perfectly aligned to the source and drain contact 320, i.e., trench 326 would be present directly above the respective source and drain contact 320. However, to illustrate the misalignment that commonly occurs during contact patterning, the trench 326 is shown in FIG. 3 to be slightly offset such that it is present over portions of both the gate cap 318, the source/drain cap 322 and the spacer 314 therebetween.

As shown in FIG. 3, trench 326 extends through the ILD 324 and the source/drain cap 322. According to an exemplary embodiment, a directional (anisotropic) etching process such as RIE, is employed to pattern the trench 326. Notably, the etch-selectivity of 1) the source/drain cap 322 vis-à-vis the gate cap 318 and 2) the source/drain cap 322 vis-à-vis the spacers 314 prevents the opening of any direct connections between the source and drain contact 320 and the replacement metal gate 112 during the trench 326 etch.

Trench 328 corresponds to the footprint and location of a metal contact bridge to the replacement metal gate 112 and to the source and drain contact 320. Again, some misalignment is present where the trench 328 is shown in FIG. 3 to be slightly offset from the tops of the respective gate cap 318 and the source/drain cap 322.

As shown in FIG. 3, trench 328 extends through the ILD 324 and both the gate cap 318 and the source/drain cap 322. According to an exemplary embodiment, a directional (anisotropic) etching process such as RIE, is employed to pattern the trench 328. Due to the etch-selectivity of the spacers 314 vis-à-vis both 1) the gate cap 318 and 2) the source/drain cap 322, trench 328 is formed bridging the spacer 314 that is present between the respective gate cap 318 and the source/drain cap 322.

As shown in step 37 (a cross-sectional cut A-A'), standard lithography and etching techniques are used to pattern trenches 330 and 332 in the ILD 324. Trench 330 corresponds to the footprint and location of a (first) metal contact to the replacement metal gate 112. It is notable that patterning of the trenches 326/328 and 330/332 can be performed in any order or concurrently, and the sequence depicted in the figures is merely a non-limiting example.

Ideally, trench 330 would be perfectly aligned to the replacement metal gate 112, i.e., trench 330 would be present directly above the respective replacement metal gate 112. However, to illustrate the misalignment that commonly occurs during contact patterning, the trench 330 is shown in FIG. 3 to be slightly offset such that it is present over portions of both the replacement metal gate 112, the source/drain cap 322 and the spacer 314 therebetween.

As shown in FIG. 3, trench 330 extends through the ILD 324 and the gate cap 318. According to an exemplary embodiment, a directional (anisotropic) etching process such as RIE, is employed to pattern the trench 330. Notably, the etch-selectivity of 1) the gate cap 318 vis-à-vis the source/drain cap 322 and 2) the gate cap 318 vis-à-vis the spacers 314 prevents the opening of any direct connections between the replacement metal gate 112 and the source and drain contact 320 during the trench 330 etch.

Trench 332 corresponds to the footprint and location of a metal contact bridge to the replacement metal gate 112 and to the source and drain contact 320. Again, some misalignment is present where the trench 332 is shown in FIG. 3 to be slightly offset from the tops of the respective gate cap 318 and the source/drain cap 322.

As shown in FIG. 3, trench 332 extends through the ILD 324 and both the gate cap 318 and the source/drain cap 322. According to an exemplary embodiment, a directional (anisotropic) etching process such as RIE, is employed to pattern the trench 332. Due to the etch-selectivity of the spacers 314 vis-à-vis both 1) the gate cap 318 and 2) the source/drain cap 322, trench 332 is formed bridging the spacer 314 that is present between the respective gate cap 318 and the source/drain cap 322.

Following patterning, the trenches 330/332 are filled with a contact metal(s) forming first metal contacts 334/336, respectively (see step 38) and the trenches 326/328 are filled with a contact metal(s) forming second metal contacts 338/340, respectively (see step 39). Suitable contact metals include, but are not limited to, cobalt (Co), tungsten (W), copper (Cu), aluminum (Al), ruthenium (Ru), nickel (Ni), gold (Au) and/or silver (Ag).

In an alternative process flow, the etch-selective spacers are formed by first forming the gate cap 318 on top of the replacement metal gates 112, then selectively recessing the gate spacers and forming the alternative etch-selective spacers on top of the recessed gate spacers. See, for example, methodology 600 of FIG. 6. The process flow in FIG. 6 follows from the RMG structure produced in accordance with methodology 100 of FIG. 1—described above. Accordingly, like structures are numbered alike in the figures.

Namely, replacement metal gates 112 (e.g., gate stacks including an interfacial oxide 204, a gate dielectric 206, and a gate conductor 208) are formed over an active area 102 (e.g., containing fins, nanowires, nanosheets, etc.), and source and drains 108 are formed on opposite sides of the replacement metal gates 112 which are offset from the replacement metal gates 112 by gate spacers 106. The replacement metal gates 112/source and drains 108 are then buried in an ILD 110. Exemplary materials and techniques for the fabrication thereof were provided above for each of these structures.

In this particular example, beginning from step 15 of methodology 100 of FIG. 1, the replacement metal gates 112 are then recessed (selective to the gate spacers 106) and gate caps 318 are formed on top of the recessed replacement metal gates 112. See step 60 of methodology 600 of FIG. 6. According to an exemplary embodiment, the replacement metal gates 112 are recessed using a directional (anisotropic) etching process such as RIE. To form the gate caps 318, a suitable dielectric material is deposited onto the recessed replacement metal gates 112 and then polished using a process such as CMP such that the gate caps 318 are coplanar with the tops of the gate spacers 106. As provided above, suitable dielectric materials for the gate caps 318 include, but are not limited to, nitride dielectric materials such as SiN and/or SiOCN. According to an exemplary embodiment, gate caps 318 are formed having a thickness of from about 20 nm to about 45 nm and ranges therebetween.

Next, in step 61, the gate spacers 106 are recessed (selective to the gate caps 318 and ILD 110). According to an exemplary embodiment, the gate spacers 106 are recessed using a reactive ion etching process such as RIE. In order to recess the gate spacers 106 selective to the gate caps 318, these structures need to contain different materials in order to impart etch-selectivity. By way of example only, if the gate caps 318 are formed from a nitride material, then a material such as SiBCN, SiOCN, SiOx, SiC and/or SiOC (see above) can be employed for the gate spacers 106. That way, a nitride-selective etch can be used to recess the gate spacers 106 selective to the gate caps 318.

As will become apparent from the description below, the depth of this recess sets the height of the alternative, etch-selective spacers that will be formed in between the gate and source/drain caps. As will be described in detail below, a notable design consideration is that the height of these etch-selective spacers is preferably greater than or equal to the thickness of the gate and source/drain caps in order to prevent erosion of the underlying gate spacers 106 during the cap etch. To do so, in step 61 the gate spacers 106 are recessed to a depth D, that is greater than or equal to the thickness ($TG_{CAP}$) of the gate caps 118, i.e., D>$TG_{CAP}$.

This recess of the gate spacers 106 forms gaps 315 in between the ILD 110 and the gate caps 318. It is in these gaps 315 that the etch-selective spacers will be formed.

Namely, in step 62 a conformal liner 312' is first formed over the ILD 110 and gate caps 318, filling the gaps 315 over the recessed gate spacers 106. According to an exemplary embodiment, the liner 312' is formed by depositing a suitable liner material using a conformal deposition process such as CVD or ALD to a thickness of from about 2 nm to about 10 nm, and ranges therebetween, filling/pinching off the gaps 315. Liner 312' serves as the basis for the etch-selective spacers between the gate and source/drain caps. Thus, the liner 312' needs to be formed from a material that provides etch selectivity for both the gate and source/drain caps. As provided above, suitable materials for the conformal liner 312' include, but are not limited to, metal oxides such as SiC, AlOx and/or HfOx and/or metal nitrides such as AlN.

Next, as shown in step 63, an etch back of the liner 312' is performed to form etch-selective spacers 314 alongside the gate caps 318. By way of example only, a polishing process such as CMP can be used to polish the liner 312' down to the tops of the gate spacers 106/ILD 110/gate caps 318, leaving spacers 314 (i.e., the vertical components of the claw-shaped cap) present on top of the (recessed) gate spacers 106 alongside the ILD 110 and gate caps 318. As highlighted above, the spacers 314 provide an etch-selective barrier between the gate and source/drain caps preventing gate to source/drain shorts due to gate spacer erosion.

In step 64, the ILD 110 is removed from over the source and drains 108 using a directional/anisotropic etching process such as RIE (forming trenches 319 over the source and drains 108) which in step 65 is replaced with contacts 320 (e.g., including conformal liner 404/barrier layer 406 and a fill metal 408) to the source and drains 108 (that are formed in trenches 319). These contacts 320 are also referred to herein as 'source and drain contacts.' Exemplary materials and techniques for the fabrication thereof were provided above for contacts 320.

Figure 6:
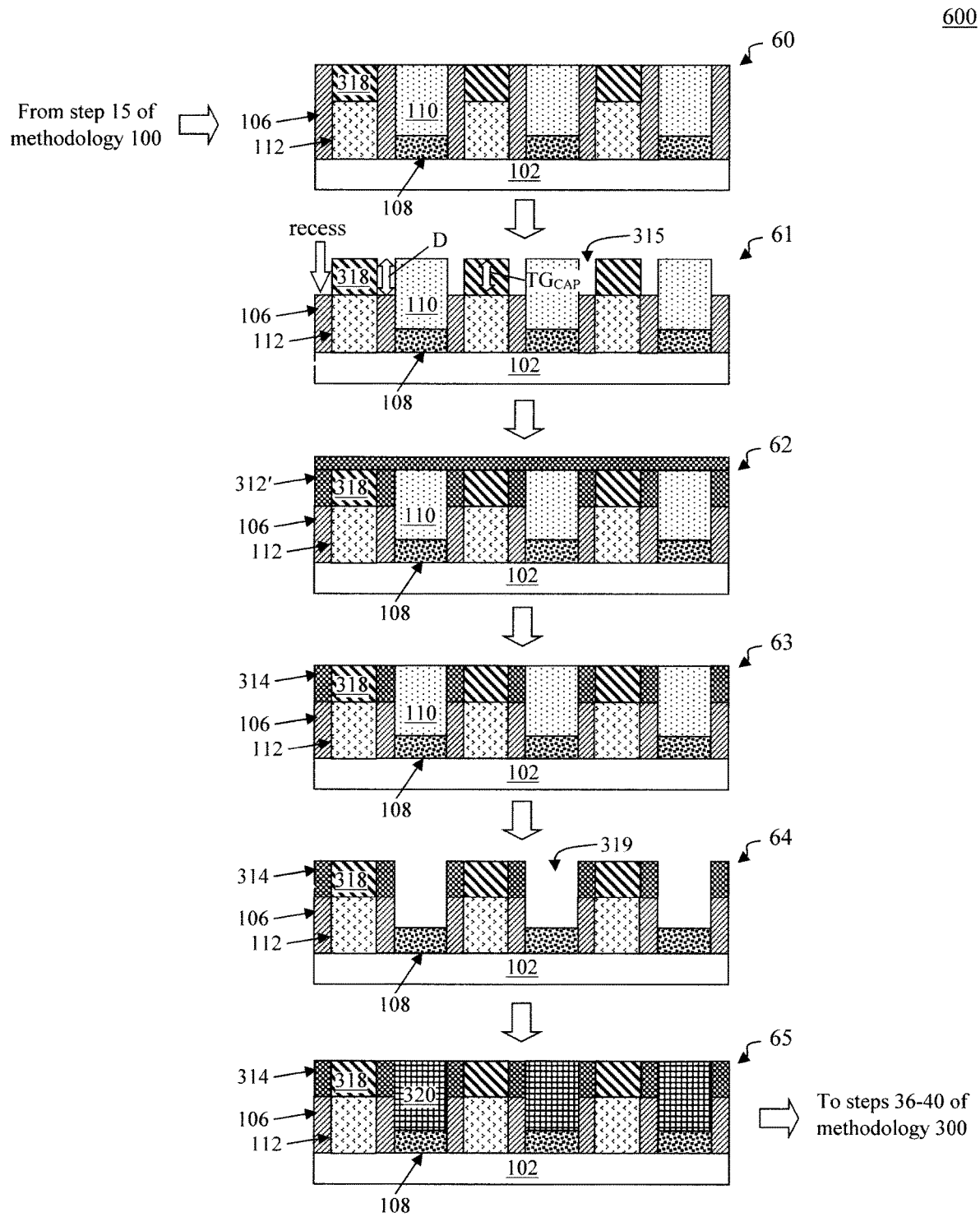
FIG. 6 is a cross-sectional diagram illustrating another exemplary methodology for forming a gate contact over active device with claw-shaped source and drain caps according to an embodiment of the present invention.

The balance of the process is the same as that described in accordance with the description of steps 36-40 of methodology 300 of FIG. 3 above, including depositing an ILD 324 onto the gate caps 318 and source/drain caps 322, forming first/second metal contacts 334/336 and 338/340 to the replacement metal gates 112 and source and drain contacts 320, respectively, etc. Thus, as shown in FIG. 6, the process of methodology 600 continues from step 65 to steps 36-40 of methodology 300 of FIG. 3 as described in detail above.

Figure 7:
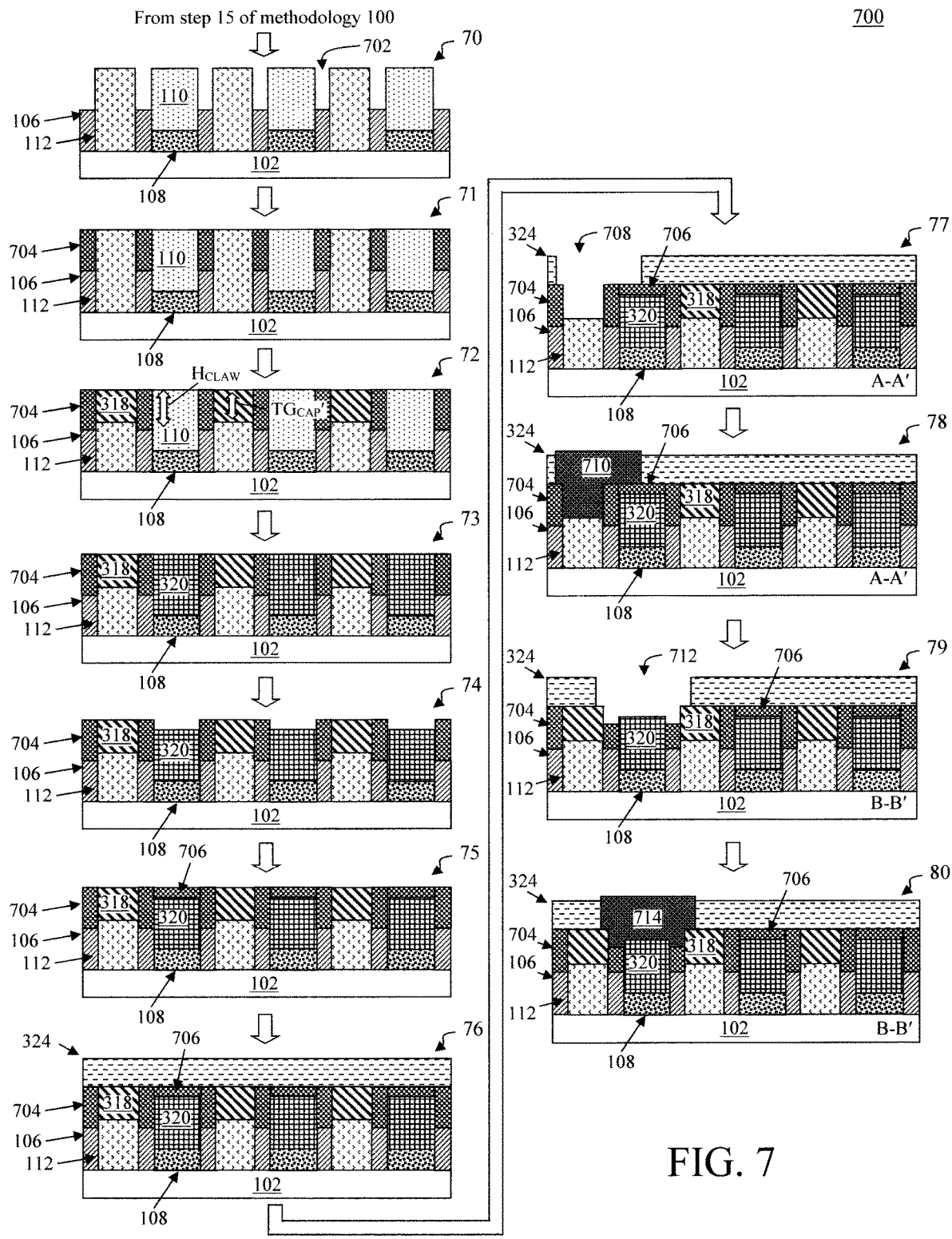
FIG. 7 is a cross-sectional diagram illustrating yet another exemplary methodology for forming a gate contact over active device with claw-shaped source and drain caps according to an embodiment of the present invention.

Yet another exemplary embodiment for forming the present claw-shaped caps is now described by way of reference to methodology 700 of FIG. 7. The process flow in FIG. 7 follows from the RMG structure produced in accordance with methodology 100 of FIG. 1—described above. Accordingly, like structures are numbered alike in the figures.

Namely, replacement metal gates 112 (e.g., gate stacks including an interfacial oxide 204, a gate dielectric 206, and a gate conductor 208) are formed over an active area 102 (e.g., containing fins, nanowires, nanosheets, etc.), and source and drains 108 are formed on opposite sides of the replacement metal gates 112 which are offset from the replacement metal gates 112 by gate spacers 106. The replacement metal gates 112/source and drains 108 are then buried in an ILD 110. Exemplary materials and techniques for the fabrication thereof were provided above for each of these structures.

In this particular example, beginning from step 15 of methodology 100 of FIG. 1, the gate spacers 106 are recessed (selective to the replacement metal gates 112) forming trenches 702 in between the replacement metal gates 112 and the ILD 110. See step 70. According to an exemplary embodiment, the gate spacers 106 are recessed using a directional (anisotropic) etching process such as a selective RIE. As above, the present claw-shaped caps will be formed over the source and drain contacts which provide an etch-selective barrier between the gate and source/drain caps preventing gate to source/drain shorts due to gate spacer erosion. The vertical component of the claw-shaped caps is next formed in the trenches 702.

To form the vertical component, in step 71 the trenches 702 are filled with a (first) source and drain cap material over the recessed gate spacers 106. According to an exemplary embodiment, the first source and drain cap material is deposited using a conformal deposition process such as CVD or ALD filling/pinching off the trenches 702. Excess material is removed using a process such as CMP, leaving vertical component 704 of the claw-shaped source/drain caps present between the replacement gates 112 and the ILD 110 on top of the recessed gate spacers 106. Suitable materials for the first source and drain cap material include, but are not limited to, metal oxides such as SiC, AlOx and/or HfOx and/or metal nitrides such as AlN. As provided above, these materials provide etch selectivity vis-à-vis the gate cap (see, e.g., gate cap 318, below).

In step 72, the replacement metal gates 112 are next recessed (selective to the vertical component 704 of the claw-shaped source/drain caps) and gate caps 318 are formed on top of the recessed replacement metal gates 112 in between the vertical component 704 of the claw-shaped source/drain caps. According to an exemplary embodiment, the replacement metal gates 112 are recessed using a reactive etching process such as RIE. To form the gate caps 318, a suitable dielectric material is deposited onto the recessed replacement metal gates 112 and then polished using a process such as CMP such that the gate caps 318 are coplanar with the tops of the vertical component 704 of the claw-shaped source/drain caps. As provided above, suitable dielectric materials for the gate caps 318 include, but are not limited to, nitride dielectric materials such as SiN and/or SiOCN. According to an exemplary embodiment, gate caps 318 are formed having a thickness of from about 20 nm to about 45 nm and ranges therebetween.

As highlighted above, a notable design consideration is that the height of the vertical component 704 of the claw-shaped source/drain caps is preferably greater than or equal to the thickness of the gate and source/drain caps in order to prevent erosion of the underlying gate spacers 106 during the cap etch. See, for example, FIG. 7 where the height ($H_{CLAW}$) of the vertical component 704 of the claw-shaped source/drain caps is greater than or equal to the thickness ($TG_{CAP}'$) of the gate caps 318, i.e., $H_{CLAW}$>$TG_{CAP}'$.

In step 73, the ILD 110 is removed from over the source and drains 108 using a directional/anisotropic etching process such as RIE and replaced with source and drain contacts 320 (e.g., including conformal liner 404/barrier layer 406 and a fill metal 408) to the source and drains 108 in between the vertical component 704 of the claw-shaped source/drain caps. These contacts 320 are also referred to herein as 'source and drain contacts.' Exemplary materials and techniques for the fabrication thereof were provided above for contacts 320.

In step 74, the source and drain contacts 320 are recessed. According to an exemplary embodiment, the source and drain contacts 320 are recessed using a directional (anisotropic) etching process such as RIE.

In step 75, the horizontal component of the claw-shaped caps is formed over the recessed source and drain contacts 720. According to an exemplary embodiment, the horizontal component of the claw-shaped caps is formed by depositing a (second) source and drain cap material onto the recessed source and drain contacts 320 using a conformal deposition process such as CVD or ALD. Excess material is then removed using a process such as CMP, leaving horizontal component 706 of the claw-shaped source/drain caps present on top of the recessed source and drain contacts 320. As shown in FIG. 7, the vertical/horizontal components 704/706 of the source/drain caps together form an inverted 'U' or claw-shaped cap over the source and drain contacts 320. Suitable materials for the second source and drain cap material include, but are not limited to, SiC, metal oxides such as AlOx and/or HfOx and/or metal nitrides such as AlN. As provided above, while different materials can be used for the first/second vertical/horizontal components 704/706 of the claw-shaped caps, in some embodiments contemplated herein both the vertical/horizontal components of the claw-shaped source/drain caps are formed from the same material.

In step 76, a (second) ILD 324 (wherein the ILD 110 is the first ILD) is then deposited onto the gate caps 318 and claw-shaped source/drain caps 704/706. As provided above, suitable ILD materials include, but are not limited to, oxide materials such as silicon oxide (SiO$_x$). Following deposition, the ILD 324 is planarized using a process such as CMP.

First/second metal contacts are then formed to the replacement metal gates 112 and source and drain contacts 320, respectively. In the same manner as above, the process for forming these first/second metal contacts will be described by way of reference to different cross-sectional cuts through the device structure. Namely, a cross-sectional cut along A-A' will be used to depict the formation of a (first) metal contact in area 502 to a replacement metal gate 112 (labeled "G"), while a cross-sectional cut along B-B' will be used to depict the formation of a (second) metal contact in area 504 to a source and drain contacts 320 (labeled "S/D") (see FIG. 5).

Further, the description below is not intended to limit the order in which the metal contacts are formed to the particular sequence described. Namely, the description details the steps implemented to form the metal contacts to the replacement metal gates 112 and the source and drain contacts 320. In general, the process involves patterning (contact) trenches and then filling the trenches with a contact metal(s). However, while shown in separate steps, embodiments are contemplated herein, for example, where the trenches are concurrently patterned, and then filled at the same time.

In step 77 (a cross-sectional cut A-A'), standard lithography and etching techniques are used to pattern a trench 708 in the ILD 324. Specifically, trench 708 corresponds to the footprint and location of a (first) metal contact to the replacement metal gate 112. Ideally, trench 708 would be perfectly aligned to the replacement metal gate 112, i.e., trench 708 would be present directly above the respective replacement metal gate 112. However, to illustrate the misalignment that commonly occurs during contact patterning, the trench 708 is shown in FIG. 7 to be slightly offset such that it is present over portions of both the replacement metal gate 112 and the claw-shaped cap 704/706.

As shown in FIG. 7, trench 708 extends through the ILD 324 and the gate cap 318. According to an exemplary embodiment, a directional (anisotropic) etching process such as RIE is employed to pattern the trench 708. Notably, the etch-selectivity of the gate cap 318 vis-à-vis the claw-shaped cap 704/706 prevents the opening of any direct connections between the replacement metal gate 112 and the source and drain contact 320 during the trench 708 etch.

In step 78, the trench 708 is filled with a contact metal(s) forming first metal contact 710. As provided above, suitable contact metals include, but are not limited to, Co, W, Cu, Al, Ru, Ni, Au and/or Ag.

The same general process is then used to form a (second) metal contact to the source and drain contact 320. Namely, in step 79 (a cross-sectional cut B-B'), standard lithography and etching techniques are used to pattern a trench 712 in the ILD 324. Trench 712 corresponds to the footprint and location of a (second) metal contact to the source and drain contact 320. Ideally, trench 712 would be perfectly aligned to the source and drain contact 320, i.e., trench 712 would be present directly above the respective source and drain contact 320. However, to illustrate the misalignment that commonly occurs during contact patterning, the trench 712 is shown in FIG. 7 to be slightly offset such that it is present over the claw-shaped cap 704/706 and portions of the adjacent replacement metal gates 112.

As shown in FIG. 7, trench 712 extends through the ILD 324 and the claw-shaped cap 704/706. According to an exemplary embodiment, a directional (anisotropic) etching process such as RIE, is employed to pattern the trench 712. Notably, the etch-selectivity of the claw-shaped cap 704/706 vis-à-vis the gate cap 318 prevents the opening of any direct connections between the source and drain contact 320 and the replacement metal gate 112 during the trench 712 etch.

In step 80, the trench 712 is filled with a contact metal(s) forming second metal contact 714. As provided above, suitable contact metals include, but are not limited to, Co, W, Cu, Al, Ru, Ni, Au and/or Ag.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for forming a gate contact over active device, the method comprising the steps of:
   forming a device comprising metal gates over an active area of a wafer, and sources and drains on opposite sides of the gates offset from the gates by gate spacers;
   recessing the metal gates and the gate spacers;
   forming etch-selective spacers on top of the recessed gate spacers;
   forming gate caps on top of the recessed metal gates in between the etch-selective spacers;
   forming source and drain contacts on the sources and drains;
   forming source and drain caps on top of the source and drain contacts, wherein the etch-selective spacers are present between the gate caps and the source and drain caps and provide etch selectivity to both the gate caps and the source and drain caps; and forming a metal gate contact that extends through a given one of the gate caps, wherein the etch-selective spacers prevent gate-to-source drain shorting by the metal gate contact.

2. The method of claim 1, further comprising the steps of:
covering the sources and drains with an interlayer dielectric (ILD);
recessing the metal gates and the gate spacers selective to the ILD;
depositing a conformal liner on the recessed metal gates, the recessed gate spacers, and the ILD; and
etching back the liner to form the etch-selective spacers on top of the recessed gate spacers.

3. The method of claim 2, further comprising the step of:
removing the ILD prior to forming the source and drain contacts on the sources and drains.

4. The method of claim 1, further comprising the step of:
forming a metal source and drain contact that extends through a given one of the source and drain caps, wherein the etch-selective spacers prevent gate-to-source drain shorting by the metal source and drain contact.

5. The method of claim 1, further comprising the step of:
forming a metal source and drain contact that extends through another given one of the gate caps and a given one of the source and drain caps and is present over a given one of the etch-selective spacers.

6. The method of claim 1, wherein the gate caps comprise a material selected from the group consisting of: silicon nitride (SiN), silicon oxycarbonitride (SiOCN), and combinations thereof.

7. The method of claim 1, wherein the etch-selective spacers comprise a material selected from the group consisting of: silicon carbide (SiC), aluminum oxide (AlOx), hafnium oxide (HfOx), aluminum nitride (AlN), and combinations thereof.

8. The method of claim 7, wherein the source and drain caps comprise a different material from etch-selective spacers selected from the group consisting of: SiC, AlOx, HfOx, AlN, and combinations thereof.

9. The method of claim 8, wherein the source and drain caps comprise a higher-κ material than the etch-selective spacers.

10. The method of claim 9, wherein the etch-selective spacers comprise AlOx, and wherein the source and drain caps comprise HfOx.

11. The method of claim 1, wherein the etch-selective spacers have a height $H_{SPACER}$, wherein the source and drain caps have a thickness $T_{CAP}$, and wherein $H_{SPACER} \geq T_{CAP}$.

12. The method of claim 1, further comprising the steps of:
depositing another ILD onto the gate caps, the source and drain caps and the etch-selective spacers;
patterning a trench in the other ILD that extends through the given gate cap, wherein the etch-selective spacers prevent erosion of the gate spacers during the patterning; and
filling the trench with at least one contact metal to form the metal gate contact.

13. A gate contact over active device, comprising:
metal gates over an active area of a wafer;
sources and drains on opposite sides of the metal gates offset from the metal gates by gate spacers;
gate caps on top of the metal gates;
an etch-selective material directly contacting a top surface of the gate spacers alongside the gate caps which provides etch selectivity to the gate caps;
source and drain contacts on the sources and drains;
source and drain caps on top of the source and drain contacts; and
a metal gate contact that extends through a given one of the gate caps, wherein the etch-selective material prevents gate-to-source drain shorting by the metal gate contact.

14. The gate contact over active device of claim 13, wherein the etch-selective material comprises etch-selective spacers that are present between the gate caps and the source and drain caps, and wherein the etch-selective spacers provide etch selectivity to both the gate caps and the source and drain caps.

15. The gate contact over active device of claim 13, wherein the etch-selective material is a component of the source and drain caps which form claw-shaped caps over the source and drain contacts.

* * * * *